United States Patent [19]

Itoh et al.

[11] Patent Number: 4,701,482

[45] Date of Patent: Oct. 20, 1987

[54] EPOXY RESIN COMPOSITION FOR ENCAPSULATION OF SEMICONDUCTOR DEVICES

[75] Inventors: Kunio Itoh; Toshio Shiobara; Koji Futatsumori; Kazutoshi Tomiyoshi; Hisashi Shimizu, all of Annaka, Japan

[73] Assignee: Shin-Etsu Chemical Co., Ltd., Tokyo, Japan

[21] Appl. No.: 865,416

[22] Filed: May 21, 1986

[30] Foreign Application Priority Data

May 24, 1985 [JP] Japan ................................. 60-111557

[51] Int. Cl.[4] .......................... C08K 3/24; C08K 9/06; C08L 63/00
[52] U.S. Cl. .................................... 523/435; 523/443; 523/444
[58] Field of Search ........................ 523/435, 443, 444

[56] References Cited

U.S. PATENT DOCUMENTS 4,082,719  4/1978  Liles et al. ........................... 523/435
4,125,510  11/1978  Antonen ............................... 523/435

FOREIGN PATENT DOCUMENTS 2807504  9/1978  Fed. Rep. of Germany ...... 523/435
56-160054  12/1981  Japan ................................... 523/435

Primary Examiner—Allan M. Lieberman
Attorney, Agent, or Firm—Hopgood, Calimafde, Kalil, Blaustein & Judlowe

[57] ABSTRACT

An epoxy resin-based composition suitable for encapsulation of semiconductor devices is proposed. The resin composition is capable of giving a cured resin encapsulation highly resistant against crack formation by virtue of the unique ingredient therein, in addition to the thermally curable epoxy resin and an inorganic filler, which is a combination of an organopolysiloxane having a hydrocarbon group substituted by certain functional groups, e.g. glycidyl, amino, mercapto and the like, and a block copolymer composed of the segments of a polymeric aromatic moiety and segments of an organopolysiloxane moiety.

1 Claim, No Drawings

EPOXY RESIN COMPOSITION FOR ENCAPSULATION OF SEMICONDUCTOR DEVICES

BACKGROUND OF THE INVENTION

The present invention relates to an epoxy resin composition suitable for encapsulation of semiconductor devices, or, more particularly, to an epoxy resin-based composition suitable for encapsulation of various kinds of semiconductor devices such as ICs, LSIs, VLSIs and the like exhibiting excellent resistance against moisture, high dimensional stability and low mechanical stress.

Various kinds of synthetic resin compositions are known and used in the prior art as a material for the encapsulation of semiconductor devices including silicone resins, diallyl phthalate resins, phenolic resins, polyphenylene sulfide resins as the principal component thereof. Among these conventional resin compositions, epoxy resin-based compositions are currently used most widely and in the largest quantity in view of the excellent characteristics thereof such as the mechanical and electrical properties, heat resistance, adhesiveness, workability in molding and so on.

These epoxy resin-based compositions, however, are not free from several problems and disadvantages. Along with the trend in recent years toward further and fruther decreased thickness and size of electronic parts to facilitate a compact design of electronic instruments and larger and larger size of semiconductor devices to meet the requirement for an increased density of integration thereon, for example, problems are involved more and more in the undesirable phenomena of crack formation in the resin encapsulation and silicon chips, passivation cracks, mobility of aluminum wirings and so on. Accordingly, the resin compositions used for encapsulation of semiconductor devices should satisfy all of the requirements in respect of the stability against crack formation, moisture resistance, low coefficient of thermal expansion, low elastic modulus, high glass transition point and the like in order that the encapsulated semiconductor devices can withstand severe heat cycles and mechanical shocks. None of the conventional resin compositions for semiconductor encapsulation, however, is satisfactory in one or more respects.

While most of the epoxy resin-based compositions currently used for encapsulation of semiconductor devices are prepared by compounding a novolac-type epoxy resin with a large amount of an amorphous or crystalline silica filler, a crosslinking agent such as a phenol novolac and curing catalyst to promote curing by heating, any improvement in one respect is always achieved at the sacrifice of one or more of other properties so that the above mentioned requirements cannot be satisfied altogether at one time.

The inventors have previously proposed an epoxy resin-based composition for semiconductor encapsulation (see Japanese Patent Kokai No. 56-129246) by compounding an epoxy resin with an organopolysiloxane represented by the general formula $[(-SiR_2-Z-SiR_2-O-)_a(-SiR_2-O-)_b]_n$, in which R is a substituted or unsubstitued monovalent hydrocarbon group, Z is a divalent organic group, n is a positive number having an average value of at least 10 and a and b are each zero or a positive number with the proviso that $a+b=1$. A problem in such a composition is that no highly uniform dispersion can be obtained in the "sea-and-islands" texture of the epoxy resin and the organopolysiloxane and further the structure formed by the dispersion is sometimes unstable so that the encapsulation formed of such a composition may be subject to decrease in the mechanical strengths and increase in the moisture permeability in addition to the problem of eventual bleeding of the organopolysiloxane ingredient on the surface of the cured resin composition.

It is also disclosed in Japanese Patent Publication 60-11973 that the above mentioned epoxy resin-based composition can be improved in respect of the mold-releasability without contamination of the metal mold when the organopolysiloxane compounded with an epoxy resin is modified with certain functional groups such as epoxy groups, amino groups and the like. The epoxy resin-based composition of this type is advantageous in respect of the low mechanical stress and decreased bleeding of the organopolysiloxane by virtue of the functional groups thereof having reactivity with the epoxy resin. The problem of low dispersibility insufficient to give a uniform "sea-and-islands" texture remains still unsolved even in such a resin composition so that the encapsulation formed by curing the composition is also disadvantageous in the low mechanical strengths.

The inventors have further proposed an epoxy resin-based composition for semiconductor encapsulation highly resistant against crack formation (see Japanese Patent Kokai No. 58-21417) in which an epoxy resin is compounded with, in place of an organopolysiloxane, a block copolymer composed of the segments of a polymeric aromatic moiety and segments of an organopolysiloxane moiety. Although such a resin composition is greatly improved in respect of the resistance against crack formation as a result of the decrease in the stress obtained by the addition of the block copolymer compatible with the epoxy resin, the resistance is still insufficient under extremely severe conditions, presumably, due to the components being so compatible that they hardly form a "sea-and-islands" texture.

SUMMARY OF THE INVENTION

Thus, the epoxy resin-based composition provided by the invention suitable for encapsulation of semiconductor devices without the above described problems and disadvantages in the prior art compositions comprises:

(A) 100 parts by weight of a thermally curable epoxy resin;
(B) from 100 to 600 parts by weight of an inorganic filler; and
(C) from 1 to 50 parts by weight of a combination composed of
 (C-1) from 2% to 75% by weight of an organopolysiloxane represented by the average unit formula $$R^1{}_u R^2{}_v SiO_{(4-u-v)/2},\tag{I}$$

in which
R$^1$ is a hydrogen atom or a monovalent group selected from the class consisting of hydrocarbon groups, alkoxy groups, hydroxy group and polyoxyalkylene groups of the formula , R$^3$ being an ethylene, propylene or butylene group, R$^4$ being a hydrogen atom or a monovalent hydrocarbon group having 1 to 8 carbon atoms and m being a positive integer of 2 to 4, R$^2$ is a substituted monovalent hydrocarbon group having, in the substitutent thereon, a functional group selected from the class consisting of an epoxy, amino, hydroxy, carboxyl, mercapto, carbamoyl and carbamoylamino groups, the subscript u is a positive number and the subscript v is a positive number of at least 0.01 with the proviso that u+v is in the range from 1.90 to 2.10 inclusive, and (C-2) from 98% to 25% by weight of a copolymer composed of the segments of a polymeric aromatic moiety free of silicon atoms and segments of an organopolysiloxane moiety.

DETAILED DESCRIPTION OF THE PREFERRED EMBODIMENTS

The thermally curable epoxy resin as the component (A) is an epoxy resin mixture composed of an epoxy resin having at least two epoxy groups in a molecule and a curing agent therefor. The epoxy resin is not particularly limitative in respect of the molecular structure and molecular weight provided that it is curable when admixed with a curing agent. Accordingly, various types of conventional epoxy resins can be used including those epoxy resins prepared from epichlorohydrin and a novolac resin with a bisphenol compound included as an example, alicyclic epoxy resins, halogen-, e.g. chlorine- or bromine-, substituted epoxy resins and the like. These epoxy resins can be used either singly or as a combination of two kinds or more according to need.

It is optional that the above mentioned epoxy resin is partly replaced with a monoepoxy compound such as styrene oxide, cyclohexene oxide, porpylene oxide, methyl glycidyl ether, ethyl glycidyl ether, phenyl glycidyl ether, allyl glycidyl ether, octylene oxide, dodecene oxide and the like.

The curing agent compounded with the above mentioned epoxy resin to give a thermally curable epoxy resin is also well known in the art. Suitable curing agents include amine compounds such as diamino diphenyl methane, diamino diphenyl sulfone, metaphenylene diamine and the like, acid anhydride compounds such as phthalic anhydride, pyromellitic anhydride, benzophenone tetracarboxylic acid anhydride and the like and novolacs having at least two hydroxy groups in a molecule such as phenol novolac, cresol novolac and the like. The amount of the curing agent should be sufficient to fully cure the epoxy resin and the weight proportion of the curing agent to the epoxy resin should preferably be in the range from 1:5 to 2:1.

It is of course optional in the inventive composition, if desired, that the thermally curable epoxy resin is further combined with a curing accelerator to promote the curing reaction between the epoxy resin and the curing agent. Suitable curing accelerators include imidazole and derivatives thereof, tertiary amine compounds, phosphine derivatives, cycloamidine compounds and the like.

The inorganic filler as the component (B) in the inventive composition may be a known material conventionally used in the epoxy resin-based compositions exemplified by finely pulverized quartz, powders of fused quartz glass, synthetic silica powder, talc, mica flakes, silicon nitride, boron nitride, alumina and the like. These inorganic fillers may be used either singly or as a combination of two kinds or more according to need. The amount of the inorganic filler in the inventive composition should be in the range from 100 to 600 parts by weight or, preferably, from 250 to 550 parts by weight per 100 parts by weight of the thermally curable epoxy resin as the component (A). When the amount of the inorganic filler is too small, the resultant epoxy resin-based composition cannot give a cured encapsulation having low stress and high resistance against crack formation. When the amount of the inorganic filler is too large, on the other hand, difficulties are encountered in obtaining uniform dispersion of the filler in the epoxy resin or the resin composition may be poorly flowable to decrease the productivity in the molding works thereof.

The third component, i.e., the component (C), is a combination of two specific constituents (C-1) and (C-2) in a specified weight proportion. The component (C-1) is an organopolysiloxane represented by the above given average unit formula (I). In the formula, the symbol $R^1$ denotes a hydrogen atom or a monovalent group selected from the class consisting of hydrocarbon groups, alkoxy groups, hydroxy group and polyoxyalkylene groups. The monovalent hydrocarbon groups are exemplified by alkyl groups, e.g. methyl, ethyl, propyl and butyl groups, alkenyl groups, e.g. vinyl and allyl groups, aryl groups, e.g. phenyl and tolyl groups, and cycloalkyl groups, e.g. cyclohexyl group. These hydrocarbon groups may be substituted by substituents such as halogen atoms and cyano groups for a part or all of the hydrogen atoms but the substituted hydrocarbon groups in conformity with the definition of $R^2$ given below are excluded from the definition of $R^1$. Suitable substituted hydrocarbon groups include chloromethyl, 3,3,3-trifluoropropyl and cyanomethyl groups. The alkoxy groups are exemplified by methoxy, ethoxy, propoxy and butoxy groups. The polyoxyalkylene groups are represented by the general formula $+R^3-O)_{\overline{m}}R^4$, in which $R^3$ is an alkylene group selected from the class consisting of ethylene, propylene and butylene groups, $R^4$ is a hydrogen atom or a monovalent hydrocarbon group having 1 to 8 carbon atoms and m is a positive integer of 2 to 4. The symbol $R^2$ denotes a substituted monovalent hydrocarbon group having, in the substituent thereof, a functional group selected from the class consisting of an epoxy group

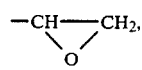

amino group —$NH_2$, hydroxy group —OH, carboxyl group —COOH, mercapto group —SH, carbamoyl group —CO—$NH_2$ and carbamoylamino group —NH—CO—$NH_2$ or, preferably, epoxy and amino groups. Exemplary of the group denoted by $R^2$ are epoxy, 3-glycidyloxypropyl, 2-(3,4-epoxycyclohexyl)ethyl, 3-aminopropyl, 3-(2-aminoethyl)propyl, 3-mercaptopropyl, 3-(carbamoylamino)propyl, 3-carbamoylpropyl, 4-carboxylbutyl and 3-(4-hydroxyphenyl)propyl groups. It is essential that the organopolysiloxane has at least one group denoted by $R^2$ in a molecule. A single molecule of the organopolysiloxane may have two kinds or more of the groups denoted by $R^1$ and/or two kinds of the groups denoted by $R^2$. The subscript u is a positive number and the subscript v is also a positive number of, preferably, at least 0.01 with the proviso that u+v is in the range from 1.90 to 2.10 inclusive. The ratio of v/(u+v) should preferably not exceed 0.5. The limitation in the total of the subscripts u and v means that the molecular structure of the organopolysiloxane is substantially linear.

The organopolysiloxane as the component (C-1) is in itself flexible as an inherency of the molecules so that addition of the same may greatly contribute to the improvement of the resin composition in respect of the resistance against crack formation and is also effective to facilitate incorporation of a large amount of the inorganic filler as the component (B) into the composition. Moreover, the glass transition point of the epoxy resin is free from the decreasing effect by the incorporation of this component due to the low miscibility thereof with the epoxy resin.

The component (C-2) combined with the above described organopolysiloxane as the component (C-1) is a copolymer composed of the segments of a polymeric aromatic moiety and segments of an organopolysiloxane moiety. The polymeric aromatic moiety here implied is exemplified by those expressed by the following structural formulas:

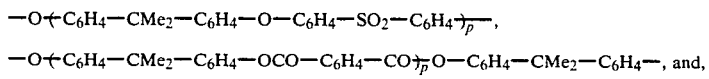

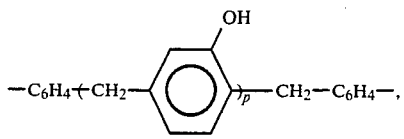

so that the copolymer composed of these two types of polymeric moieties is expressed, for example, by the following structural formulas:

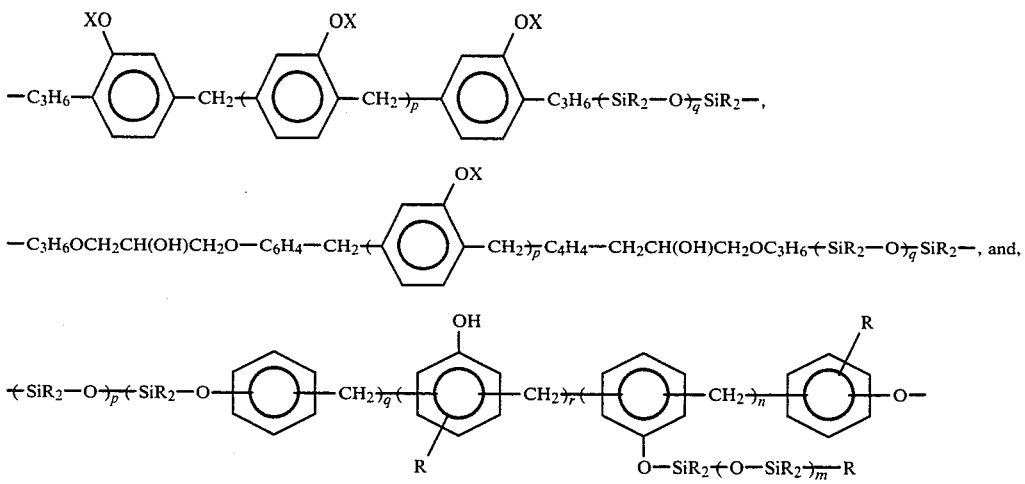

in which Me is a methyl group, $C_6H_4$ is a 1,4-phenylene group, the subscripts p, q, r, m and n are each a positive integer, X is a hydrogen atom or a glycidyl group and R is a monovalent hydrocarbon group. Suitable block copolymers are described in detail, for example, in Japanese Patent Kokai No. 58-21417.

The component (C-2) should preferably have, in a molecule, at least one group reactive with the epoxy resin or the curing agent therefor. When the polymeric aromatic moiety has epoxy groups or is derived from a phenolic resin, the component (C-2) per se may serve as a supplementary constituent for the principal ingredient or the curing agent.

The component (C) should be composed of the part components (C-1) and (C-2) in a weight proportion in the range from 2:98 to 75:25. When the weight proportion of the component (C-2) relative to the component (C-1) is too small, the component (C-1) is poorly dispersible in the component (A). When the weight proportion of the component (C-2) relative to the component (C-1) is too large, on the other hand, the epoxy resin-based composition may have a decreased glass transition point. The epoxy resin-based composition of the invention should contain from 1 to 50 parts by weight or, preferably, from 2 to 40 parts by weight of the component (C), i.e. a combination of the components (C-1) and (C-2), per 100 parts by weight of the component (A). When the amount of the component (C) is too small, the desired effect of improving the resistance against crack formation of the cured resin composition cannot be achieved as a matter of course. When the amount of the component (C) is too large in the resin composition, on the other hand, the resin composition as cured may have somewhat decreased mechanical properties.

The epoxy resin-based composition of the invention can be prepared by uniformly blending the above described components (A), (B) and (C) each in a calculated and weighed amount using a suitable blending machine such as kneaders, roller mills, extruders and the like. The part components (C-1) and (C-2) of the component (C) can be admixed with the other components either separately or as a premix thereof. It is optional according to need that the resin composition is further admixed with various kinds of known additives including mold release agents, coloring agents, antioxidants, flame retardant agents, carbon-functional silanes and the like. The order of blending the components is not particularly limitative. When the components (A) and (C) are solid at room temperature, for example, it is sometimes advantageous that at least a portion of each of these solid components is melted by heating prior to blending with other ingredients. These solid components may be blended as dissolved in an organic solvent followed by stripping of the solvent after blending with other ingredients. The inorganic filler as the component (B) may be surface-treated in advance with a carbon-functional silane compound.

As is understood from the above given description, the epoxy resin-based composition of the invention is characteristic in the formulation of the component (C) which is a combination of the part components (C-1) and (C-2) each as an organosilicon-containing polymeric material. By virtue of these components compounded therein, the epoxy resin-based composition of the invention as cured is imparted with remarkably improved resistance against crack formation, mechanical strengths and moisture resistance as well as greatly decreased thermal expansion coefficient and elastic modulus and increased glass transition point so that the resin composition is useful as a material for encapsulation of semiconductor devices.

In the following, Examples and Comparative Examples are given to illustrate the epoxy resin-based composition of the invention in more detail. In the description below, the expression of "parts" refers to "parts by weight" in each occurrence. The determination of the properties for the evaluation of the resin compositions was undertaken in the following procedures.

(1) Spiral flow

The value of spiral flow was determined by molding the resin composition at 160° C. under a pressure of 70 kg/cm² using a metal mold according to the specification of EMMI.

(2) Mechanical strengths

The measurements of the flexural strength and elastic flexural modulus were undertaken according to the procedure specified in JIS K 6911 using test specimens having dimensions of 10 mm by 4 mm by 100 mm prepared by molding the resin composition at 160° C. for 3 minutes under a pressure of 70 kg/cm² followed by a post-cure at 180° C. for 4 hours.

(3) Thermal expansion coefficient and glass transition point

Measurements were performed of a test piece of 4 mm diameter and 15 mm length in a dilatometer at a rate of temperature elevation of 5° C./minute.

(4) Cracking resistance test

A silicon chip of 9.0 mm by 4.5 mm by 0.5 mm was adhesively bonded to a 14 PIN-IC frame (42 alloy) and they are encapsulated together with the resin composition under conditions of 160° C. for 3 minutes followed by a post-cure at 180° C. for 4 hours. Fifty pieces of the thus prepared test specimens were subjected to a temperature-cycle test of which each cycle was composed of a chilling stage at −196° C. for 1 minute and a heating stage at 260° C. for 30 seconds and the number of the test specimens on which cracks were found was counted after 30 cycles and given in % of the overall number of the test specimens used for the test.

(5) Water absorption

A disc of 50 mm diameter and 3 mm thickness was prepared by molding the resin composition at 160° C. for 3 minutes followed by a post-cure at 180° C. for 4 hours and the thus prepared test specimen was heated in water at 120° C. using a pressure cooker for 100 hours to determine the weight increase.

(6) Surface bleeding

A disc specimen of 90 mm diameter and 2 mm thickness was prepared of the resin composition under the same molding conditions as above and the condition of surface bleeding was visually examined to give the results in three ratings of A, B and C for the surface condition of absolutely no bleeding, very slight bleeding and clearly noticeable bleeding, respectively.

EXAMPLES 1 to 4 and COMPARATIVE EXAMPLES 1 to 4

Eight epoxy resin-based compositions were prepared by melting and uniformly blending together the component materials according to the formulation given in Table 1 below by the amounts in parts using a hot two-roller mill and the properties thereof were determined to give the results shown in Table 1. Each of the component materials formulated is characterized as follows. In the following, the symbols Me, Ph and GlP each denote methyl, phenyl and 3-glycidyloxypropyl groups, respectively.

Epoxycresol novolac: an epoxidated cresol novolac resin having an epoxy equivalent of 200, EOCN 1020, a product by Nippon Kayaku Co.

Phenol novolac: a phenol novolac resin, TD 2090, a product by Dai-Nippon Ink Chemical Co.

Diorganopolysiloxane I:

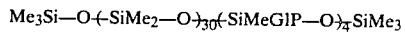

Diorganopolysiloxane II:

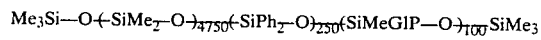

Block copolymer I: a 50:50 by weight block copolymer of dimethylpolysiloxane and phenolic resin of the formula

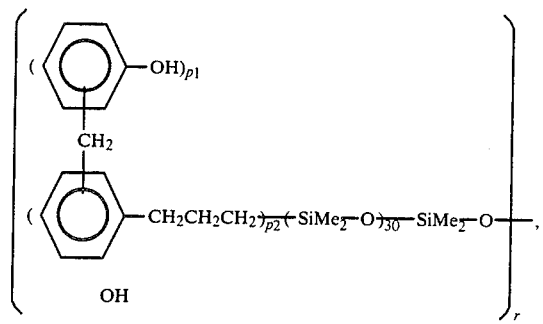

in which $p_1:p_2 = 7:3$ and r is 3

Filler: an amorphous quartz powder having an average particle diameter of 12 μm, RD 8, a product by Tatsumori Co.

Gl-silane: 3-glycidyloxypropyl trimethoxy silane, KBM 403, a product by Shin-Etsu Chemical Co.

Wax: carnauba wax

CB: carbon black

TPP: triphenyl phosphine

Sb₂O₃: antimony trioxide

TABLE 1

| | Example | | | | Comparative Example | | | |
|---|---|---|---|---|---|---|---|---|
| | 1 | 2 | 3 | 4 | 1 | 2 | 3 | 4 |
| Epoxycresol novolac | 58 | 57 | 55 | 58 | 61 | 48 | 65 | 65 |
| Phenol novolac | 28 | 22 | 30 | 28 | 29 | 27 | 35 | 35 |
| Diorgano-polysiloxane I | 4.0 | — | — | — | — | — | — | — |
| Diorgano- | — | 1.0 | 10.0 | 4.0 | — | 20.0 | — | — |

TABLE 1-continued

| | Example | | | | Comparative Example | | | |
|---|---|---|---|---|---|---|---|---|
| | 1 | 2 | 3 | 4 | 1 | 2 | 3 | 4 |
| polysiloxane II | | | | | | | | |
| Block copolymer I | 10.0 | 20.0 | 5.0 | 10.0 | 10.0 | 5.0 | — | — |
| Filler | 260 | 260 | 260 | 260 | 260 | 260 | 260 | 230 |
| Gl-silane | 1.5 | 1.5 | 1.5 | 1.5 | 1.5 | 1.5 | 1.5 | 1.5 |
| Wax | 1.5 | 1.5 | 1.5 | 1.5 | 1.5 | 1.5 | 1.5 | 1.5 |
| CB | 1.0 | 1.0 | 1.0 | 1.0 | 1.0 | 1.0 | 1.0 | 1.0 |
| TPP | 1.0 | 1.0 | 1.0 | 1.0 | 1.0 | 1.0 | 1.0 | 1.0 |
| $Sb_2O_3$ | 10.0 | 10.0 | 10.0 | 10.0 | 10.0 | 10.0 | 10.0 | 10.0 |
| Spiral flow, inches | 30 | 27 | 29 | 31 | 28 | 26 | 25 | 35 |
| Flexural strength, $kg/mm^2$ | 12.0 | 12.5 | 10.8 | 12.0 | 10.9 | 8.4 | 13.0 | 12.5 |
| Elastic flexural modulus, $kg/mm^2$ | 1100 | 1300 | 1060 | 1150 | 1050 | 1000 | 1500 | 1300 |
| Thermal expansion coefficient, $\times 10^{-5}/°C$. | 1.8 | 1.9 | 1.8 | 1.8 | 1.8 | 1.8 | 1.8 | 2.2 |
| Glass transition point, °C. | 158 | 161 | 157 | 156 | 157 | 156 | 160 | 157 |
| Cracking resistance test, % | 0 | 2 | 0 | 0 | 28 | 24 | 90 | 88 |
| Water absorption, % by weight | 0.8 | 0.8 | 0.8 | 0.8 | 0.8 | 0.8 | 0.8 | 0.8 |

EXAMPLES 5 to 8 and COMPARATIVE EXAMPLES 5 to 7

In the first place, a phenolic/silicone block copolymer, referred to as the block copolymer II hereinbelow, was prepared by dissolving each 50 g of a phenolic polymer of the formula

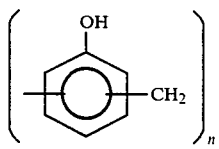

and a methoxy-containing methyl phenyl polysiloxane of the formula

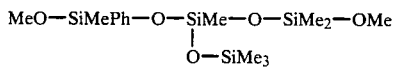

in 200 g of methyl isobutyl ketone with admixture of 1 g of p-toluene sulfonic acid and heating the solution at 115° C. for 6 hours followed by removal of the solvent. Then, 1000, 500, 200, 50 or 20 parts of this block copolymer II were melted together with 100 parts of an α,ω-(3-aminopropyl)-terminated dimethylpolysiloxane of the formula $H_2NC_3H_6$$-(SiMe_2-O)_{100}SiMe_2-C_3H_6NH_2$ to give 5 kinds of organosilicon-containing mixtures, referred to as the silicone mixtures I, II, III, IV and V, respectively.

Seven epoxy resin-based compositions were prepared by mixing and kneading each according to the formulation given in Table 2 below by the amounts in parts using a kneader and subjected to the determination of the properties to give the results shown in Table 2. Each of the formulated component materials is characterized as follows.

Epoxycresol novolac: an epoxidated cresol novolac resin having an epoxy equivalent of 220, EOCN 102, a product by Nippon Kayaku Co.

Phenol novolac: the same phenol novolac resin as used in Example 1

Br epoxy phenol novolac: a brominated epoxy phenol novolac resin

Silicone mixtures I to V: (see above)

Amino-containing polysiloxane:

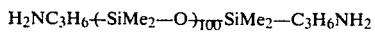

Dimethyl silicone fluid: $Me$$-(SiMe_2-O)_{2000}SiMe_3$ having a viscosity of about 1,000,000 centistokes at 25° C.

Filler: the same quartz powder as used in Example 1
Gl-silane: KBM 403, supra
Wax E: Hoechst Wax E
CB: carbon black
DBU: 1,8-diazabicyclo-(5,4,0)-undecene
$Sb_2O_3$: antimony trioxide

TABLE 2

| | Example | | | | Comparative Example | | |
|---|---|---|---|---|---|---|---|
| | 5 | 6 | 7 | 8 | 5 | 6 | 7 |
| Epoxycresol novolac | 50 | 50 | 50 | 50 | 50 | 50 | 50 |
| Phenol novolac | 20 | 20 | 20 | 20 | 20 | 20 | 20 |
| Br epoxy phenol novolac | 10 | 10 | 10 | 10 | 10 | 10 | 10 |
| Silicone mixture I | 20 | — | — | — | — | — | — |
| Silicone mixture II | — | 20 | — | — | — | — | — |
| Silicone mixture III | — | — | 20 | — | — | — | — |
| Silicone mixture IV | — | — | — | 20 | — | — | — |
| Silicone mixture V | — | — | — | — | — | 20 | — |
| Amino-containing polysiloxane | — | — | — | — | 20 | — | — |
| Dimethyl silicone fluid | — | — | — | — | — | — | 20 |
| Filler | 260 | 260 | 260 | 260 | 260 | 260 | 260 |
| Gl-silane | 2.0 | 2.0 | 2.0 | 2.0 | 2.0 | 2.0 | 2.0 |
| Wax E | 2.0 | 2.0 | 2.0 | 2.0 | 2.0 | 2.0 | 2.0 |
| CB | 1.5 | 1.5 | 1.5 | 1.5 | 1.5 | 1.5 | 1.5 |
| DBU | 1.0 | 1.0 | 1.0 | 1.0 | 1.0 | 1.0 | 1.0 |
| $Sb_2O_3$ | 20 | 20 | 20 | 20 | 20 | 20 | 20 |
| Flexural strength, $kg/mm^2$ | 10.9 | 12.0 | 13.0 | 12.5 | 8.6 | 12.5 | 7.7 |
| Elastic flexural modulus, $kg/mm^2$ | 1150 | 1160 | 1150 | 1170 | 1150 | 1150 | 1140 |
| Thermal expansion coefficient, $\times 10^{-5}/°C$. | 1.8 | 1.8 | 1.9 | 1.9 | 1.8 | 2.0 | 1.8 |
| Glass transition point, °C. | 160 | 157 | 155 | 153 | 157 | 151 | 159 |
| Cracking resistance test, % | 2 | 0 | 0 | 0 | 28 | 54 | 72 |
| Water absorption, % by weight | 0.8 | 0.8 | 0.8 | 0.8 | 0.9 | 0.8 | 1.0 |
| Surface bleeding | A | A | A | A | B | A | C |

EXAMPLE 9

Into a flask of 1-liter capacity were introduced 90 g of the same phenol novolac resin as used in the preceding examples, 30 g of the glycidyloxy-containing Diorganopolysiloxane I used in Example 1 and 300 g of methyl isobutyl ketone and the mixture was heated at 115° C. for 5 hours followed by distillation to give 98 g of a milky white solid product after removal of the solvent and cooling. This product was a mixture of the unreacted novolac resin and silicone with a copolymer thereof, 31.2% of the starting reactants having reacted according to the result of the analysis for the unreacted epoxy groups.

In the next place, an epoxy resin-based composition was prepared by melting and mixing together on a two-roller mill 40 parts of the above obtained milky white solid, 50 parts of an epoxidated cresol novolac resin having an epoxy equivalent of 200, 10 parts of a brominated epoxy phenol novolac resin, 260 parts of an amorphous quartz powder, 2 parts of 3-glycidyloxypropyl trimethoxy silane, 1 part of carnauba wax, 1 part of triphenyl phosphine, 1 part of carbon black and 10 parts of antimoby trioxide. The properties of this resin composition were: flexural strength 11.2 kg/mm$^2$; elastic flexural modulus 1190 kg/mm$^2$; thermal expansion coefficient $1.8 \times 10^{-5}$/° C.; glass transition point 163° C.; cracking resistance test 0%; water absorption 0.8%; and no surface bleeding.

What is claimed is:

1. An epoxy resin-based composition which comprises:
   (A) 100 parts by weight of a thermally curable epoxy resin;
   (B) from 100 to 600 parts by weight of an inorganic filler selected from the group consisting of finely pulverized quartz, powders of fused quartz glass, synthetic silica powder, talc, mica flakes, silicon nitride, boron nitride, alumina or mixtures thereof;
   (C) from 1 to 50 parts by weight of a combination composed of
      (C-1) from 2% to 75% by weight of an organopolysiloxane represented by the average unit formula $R^1_u R^2_v SiO_{(4-u-v)/2}$ in which $R^1$ is a hydrogen atom or a monovalent group selected from the class consisting of monovalent hydrocarbon groups, alkoxy groups, hydroxy group and polyoxyalkylene groups of the formula $-(-R^3-O-)_m R^4$, $R^3$ being an alkylene group selected from the class consisting of ethylene, propylene and butylene groups, $R^4$ being a hydrogen atom or a monovalent hydrocarbon group having 1 to 8 carbon atoms and m being a positive integer of 2 to 4, $R^2$ is a substituted monovalent hydrocarbon group having, in the substituent thereon, a functional group selected from the class consisting of epoxy, amino, hydroxy, carboxyl, mercapto, carbamoyl and carbamoylamino groups, the subscript u is a positive number and the subscript v is a positive number with the proviso that $u+v$ is in the range from 1.90 to 2,10 inclusive, and
      (C-2) from 98% to 25% by weight of a copolymer composed of the segments of a polymeric aromatic moiety free of silicon atoms and segments of an organopolysiloxane moiety; and
   (D) a sufficient amount of a suitable curing agent in a proportion by weight to the epoxy resin from about 1:5 to about 2:1.

* * * * *

UNITED STATES PATENT AND TRADEMARK OFFICE
CERTIFICATE OF CORRECTION

PATENT NO. : 4,701,482
DATED : October 20, 1987
INVENTOR(S) : Kunio Itoh et al.

It is certified that error appears in the above-identified patent and that said Letters Patent is hereby corrected as shown below:

Column 12, line 25, claim 1(C), the formula reading:

"from 1.90 to 2,10 inclusive, and," should read:

-- from 1.90 to 2.10 inclusive, and, --

Signed and Sealed this

Second Day of August, 1988

*Attest:*

DONALD J. QUIGG

*Attesting Officer*     *Commissioner of Patents and Trademarks*